United States Patent
Yang et al.

(10) Patent No.: US 11,796,691 B2
(45) Date of Patent: Oct. 24, 2023

(54) SCINTILLATOR SCREEN MANUFACTURING METHOD, SCINTILLATOR SCREEN AND CORRESPONDING IMAGE DETECTOR

(71) Applicant: NANOVISION TECHNOLOGY (BEIJING) CO., LTD, Beijing (CN)

(72) Inventors: Kai Yang, Beijing (CN); Chao Zhang, Beijing (CN); Jie Luo, Beijing (CN)

(73) Assignee: NANOVISION TECHNOLOGY (BEIJING) CO., LTD, Beijing (CN)

( * ) Notice: Subject to any disclaimer, the term of this patent is extended or adjusted under 35 U.S.C. 154(b) by 172 days.

(21) Appl. No.: 17/304,372

(22) Filed: Jun. 19, 2021

(65) Prior Publication Data

US 2021/0311210 A1    Oct. 7, 2021

Related U.S. Application Data

(63) Continuation of application No. PCT/CN2019/126365, filed on Dec. 18, 2019.

(51) Int. Cl.
*G01T 1/20* (2006.01)
*G01T 1/202* (2006.01)

(52) U.S. Cl.
CPC .......... *G01T 1/2023* (2013.01); *G01T 1/2002* (2013.01); *G01T 1/2019* (2020.05)

(58) Field of Classification Search
CPC ............................ G01T 1/2023; G01T 1/2019
See application file for complete search history.

(56) References Cited

U.S. PATENT DOCUMENTS

| | | | |
|---|---|---|---|
| 2004/0026632 A1* | 2/2004 | Struye | G21K 4/00 250/484.4 |
| 2008/0203312 A1* | 8/2008 | Kudo | G01T 1/2002 250/370.11 |
| 2013/0048865 A1* | 2/2013 | Nishino | H01L 27/14663 250/366 |

* cited by examiner

*Primary Examiner* — Hugh Maupin
(74) *Attorney, Agent, or Firm* — George Guosheng Wang; Upstream Research and Patent LLC (57) ABSTRACT

Provided are a scintillator screen manufacturing method, a scintillator screen and an image detector. The manufacturing method comprises the following steps: making a crystal column scintillator layer (4) on the predetermined surface of a flexible substrate (1); making a moisture-proof layer on the periphery of the flexible substrate (1) on which the crystal column scintillator layer (4) is formed; making an X-ray absorption layer on the other surface of the moisture-proof layer except the surface for receiving X-rays; and making a protective layer (5) on the outer surface of the X-ray absorbing layer and on the surface of the moisture-proof layer for receiving X-rays.

17 Claims, 5 Drawing Sheets

SCINTILLATOR SCREEN MANUFACTURING METHOD, SCINTILLATOR SCREEN AND CORRESPONDING IMAGE DETECTOR

BACKGROUND

Technical Field

The present invention relates to a scintillator screen manufacturing method, a scintillator screen obtained by using the manufacturing method, and an image detector using the scintillator screen, and belongs to the field of X-ray radiation imaging.

Related Art

X-ray detectors are widely used in the industrial and medical fields, and scintillator screens, as an indispensable part of the X-ray detectors, are increasingly important. At present, commonly used scintillator screens include crystal column scintillator screens and ceramic scintillator screens. The crystal column scintillator screens are made of materials represented by scintillating materials such as cesium iodide and sodium iodide, and have advantages of high brightness and high resolution. However, the crystal column scintillator screens have two major shortcomings compared to the ceramic scintillator screens (gadolinium oxysulfide, and bismuth germanate). In one respect, crystal column scintillators are moisture-prone materials, and may absorb moisture and deliquesce when exposed to air, thereby reducing the performance of the scintillator screens, and reducing the image resolution in particular. In another respect, the crystal column scintillators have low densities and high crystal column porosities. Residual X-rays can easily penetrate scintillators, and affect electronic circuits in an X-ray image sensor.

SUMMARY

A primary technical problem to be resolved in the present invention is to provide a scintillator screen manufacturing method.

Another technical problem to be resolved in the present invention is to provide a scintillator screen obtained by using the foregoing manufacturing method.

Still another technical problem to be resolved in the present invention is to provide an image detector using the foregoing scintillator screen.

To achieve the foregoing objectives, the following technical solutions are used in the present invention:

According to a first aspect of embodiments of the present invention, a scintillator screen manufacturing method is provided, including the following steps:

making a crystal column scintillator layer on a predetermined surface of a substrate;

making a moisture-proof layer on a periphery of the substrate on which the crystal column scintillator layer is formed;

making an X-ray absorption layer on a remaining surface of the moisture-proof layer except a surface for receiving X-rays; and making a protective layer on an outer surface of the X-ray absorption layer and on the surface of the moisture-proof layer for receiving X-rays.

According to a second aspect of the embodiments of the present invention, a scintillator screen manufacturing method is provided, including the following steps:

making a crystal column scintillator layer on a predetermined surface of a substrate;

making a moisture-proof layer on a periphery of the substrate on which the crystal column scintillator layer is formed;

making a first interlayer on a remaining surface of the moisture-proof layer except a surface for receiving X-rays;

making an X-ray absorption layer on an outer surface of the first interlayer;

making a second interlayer on an outer surface of the X-ray absorption layer; and making a protective layer on an outer surface of the second interlayer and on the surface of the moisture-proof layer for receiving X-rays.

Preferably, the making a crystal column scintillator layer on a predetermined surface of a substrate includes the following substeps:

selecting the substrate and a raw material to be formed into the crystal column scintillator layer; and forming, by using a vacuum evaporation method, the crystal column scintillator layer on the substrate by using the raw material to be formed into the crystal column scintillator layer.

Preferably, the substrate is selectively a substrate with a high visible light reflectivity and X-ray transmittance.

Preferably, the raw material to be formed into the crystal column scintillator layer is selectively an X-ray conversion material that converts X-rays into visible light.

Preferably, the moisture-proof layer and the protective layer are respectively transparent organic films obtained by using a chemical vapor deposition method.

Preferably, the X-ray absorption layer is an oxide film obtained from a material with a high atomic number by using a vacuum magnetron sputtering method.

Preferably, the first interlayer and the second interlayer are each an inorganic anti-reflection film obtained by using a vacuum magnetron sputtering method.

According to a third aspect of the embodiments of the present invention, a scintillator screen manufacturing method based on a flexible substrate is provided, including the following steps:

providing a flexible substrate, the flexible substrate having at least one surface with a high visible light reflectivity or a high visible light absorptivity;

fixing an other surface opposite to the surface of the flexible substrate with a high visible light reflectivity or a high visible light absorptivity on a thermally conductive rigid substrate by using a uniformly filled thermally conductive adhesive; and preparing a scintillator layer on the surface of the flexible substrate with a high visible light reflectivity or a high visible light absorptivity.

Preferably, the following step is further included: peeling off the thermally conductive rigid substrate and the thermally conductive adhesive.

Preferably, the following step is further included: preparing a waterproof protective layer on an outside of the foregoing structure, so that the waterproof protective layer covers at least the scintillator layer completely, to obtain a complete scintillator screen that is based on the flexible substrate.

Preferably, a thermal conductivity of the thermally conductive rigid substrate is greater than 10 W/mK; a thermal conductivity of the thermally conductive adhesive is greater than 1 W/mK; and a thermal expansion coefficient of the thermally conductive adhesive is to be between a thermal expansion coefficient of the flexible substrate and a thermal expansion coefficient of the thermally conductive rigid substrate.

Preferably, the thermally conductive rigid substrate is aluminum alloy, copper alloy, or stainless steel.

Preferably, the thermally conductive adhesive is glue or a double-sided tape, and a filling manner of the glue is any one of a casting method, a pulling method, screen printing, and spray coating.

Preferably, the flexible substrate has at least one surface with a visible light reflectivity of 80% to 100% or 0% to 20%.

Preferably, the flexible substrate is a transparent flexible substrate, and a light reflection layer or a light absorption layer is prepared on at least one surface of the flexible substrate.

Preferably, the peeling manner is any one of mechanical peeling, light peeling, and laser peeling.

According to a fourth aspect of the embodiments of the present invention, a scintillator screen is provided, manufactured by using the foregoing scintillator screen manufacturing method.

According to a fifth aspect of the embodiments of the present invention, an X-ray image detector using the foregoing scintillator screen is provided, an X-ray image sensor being configured at a bottom of the scintillator screen.

According to the scintillator screen manufacturing method provided in the present invention, the crystal column scintillator layer, the moisture-proof layer, the X-ray absorption layer, and the protective layer are sequentially made, to improve the X-ray absorptivity, the converted visible light transmittance, and the moisture resistance of the formed scintillator screen. In addition, the X-ray absorption layer is added to absorb X-rays that are not completely absorbed by the crystal column scintillator layer, which implements X-ray shielding of an electronic circuit of the X-ray image sensor, thereby reducing the radiation interference of X-rays on the X-ray image sensor.

BRIEF DESCRIPTION OF THE DRAWINGS

FIG. 3 to FIG. 8 sequentially show schematic sectional structure diagrams of main manufacturing process steps of a scintillator screen according to an embodiment of the present invention, where:

DETAILED DESCRIPTION

The technical content of the present invention is further described below in detail with reference to the accompanying drawings and specific embodiments.

In the embodiments of the present invention, a scintillator screen refers to a crystal column scintillator screen. The crystal column scintillator screen is configured to convert incident X-rays into visible light, and then transmit the visible light to an X-ray image sensor, so that the X-ray image sensor and an electronic circuit in the X-ray image sensor convert the received visible light into an analog signal, and the analog signal is converted into a digital signal by using an A/D converter (analog/digital converter), and is then transmitted to a computer to obtain an initial digital image of the X-rays.

Figure 1:
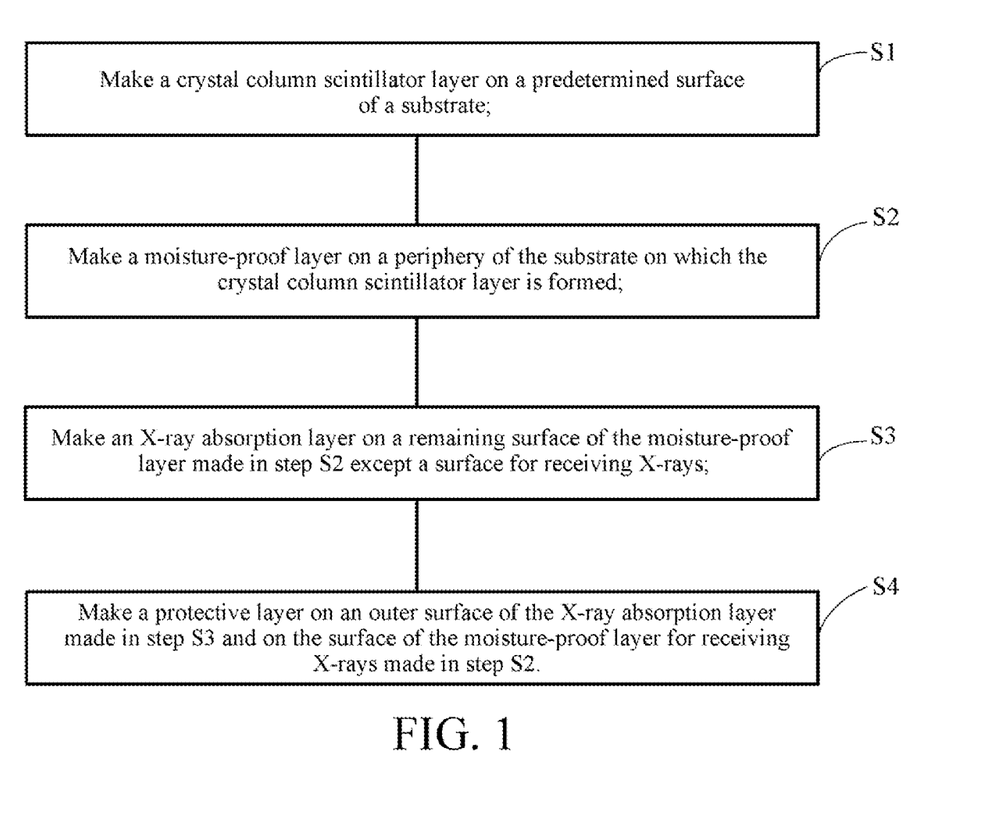
FIG. 1 is a flowchart 1 of a scintillator screen manufacturing method according to an embodiment of the present invention.

As shown in FIG. 1, a scintillator screen manufacturing method includes the following steps:

Step S1. Make a crystal column scintillator layer on a predetermined surface of a substrate.

This step includes the following substeps:

Step S11. Select the substrate and a raw material to be formed into the crystal column scintillator layer.

To ensure that X-rays can be better absorbed by the crystal column scintillator layer and converted into visible light after irradiating on the crystal column scintillator screen, a substrate with a high visible light reflectivity and X-ray transmittance may be selected. The substrate can only transmit X-rays, not visible light. For example, the substrate may be selectively a highly reflective polyethylene terephthalate (PET) substrate, an aluminum (Al) substrate, a graphite (C) substrate, a beryllium (Be) substrate, or the like of a preset thickness.

Because the crystal column scintillator layer is configured to absorb X-rays and convert the X-rays into visible light, the raw material to be formed into the crystal column scintillator layer may be selectively an X-ray conversion material that can convert X-rays into visible light. For example, the raw material to be formed into the crystal column scintillator layer may be a material such as cesium iodide (CsI) with thallium (Tl) or sodium (Na), or sodium iodide (NaI) with Tl.

Step S12. Form, by using a vacuum evaporation method, the crystal column scintillator layer on the substrate by using the raw material to be formed into the crystal column scintillator layer.

The substrate and the raw material to be formed into the crystal column scintillator layer selected in step S11 are placed in a vacuum evaporation device, to heat, under a vacuum condition, the raw material to be formed into the crystal column scintillator layer to evaporate, so that evaporated atoms or molecules are adsorbed onto the predetermined surface of the substrate to form a thin film, where the thin film is the crystal column scintillator layer. The vacuum evaporation method is an existing conventional technology, and is not described in detail herein.

An example is used below in which the substrate is selectively a highly reflective PET substrate (for example, with a thickness of 188 μm), and the raw material to be formed into the crystal column scintillator layer is selectively beaded thallium iodide particles and powdered cesium iodide materials, to describe the process of forming the crystal column scintillator layer on the substrate in this step.

Figure 3:
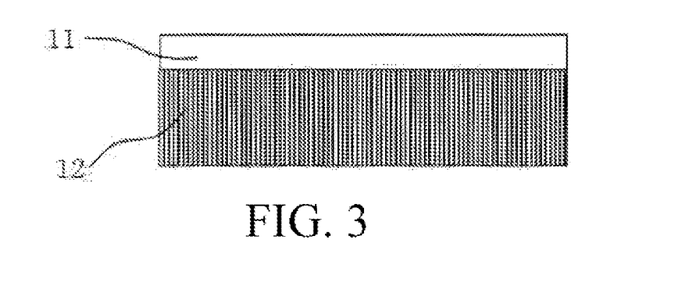
FIG. 3 is a schematic sectional structure diagram of making a crystal column scintillator layer on a lower surface of a substrate.

As shown in FIG. 3, a highly reflective PET substrate 11, the beaded thallium iodide particles and the powdered cesium iodide materials are placed in the vacuum evaporation device, to heat, under a vacuum condition, the beaded thallium iodide particles and the powdered cesium iodide materials to evaporate by using a co-evaporation method, so that evaporated atoms or molecules are adsorbed onto a lower surface of the highly reflective PET substrate 11, thereby forming a crystal column cesium iodide layer 12. The crystal column cesium iodide layer 12 is configured to convert X-rays into visible light.

Step S2. Make a moisture-proof layer on a periphery of the substrate on which the crystal column scintillator layer is formed.

Because the crystal column scintillator layer (for example, the foregoing crystal column cesium iodide layer 12) is highly hygroscopic, if the crystal column scintillator layer is directly exposed to the air, the crystal column scintillator layer interacts with water vapor in the air to cause scintillator screen crystal columns to deliquesce and be sticky, thereby affecting an image resolution effect. In addition, due to certain gaps between the crystal columns in the crystal column scintillator layer, a lower surface of the crystal column scintillator layer is uneven, and residual X-rays may penetrate through the crystal column scintillator layer to affect the electronic circuit in the X-ray image sensor. Therefore, a chemical vapor deposition (CVD) method may be used to deposit a moisture-proof layer on a periphery of the substrate with the crystal column scintillator layer and formed in step S1.

The moisture-proof layer may be a transparent organic film obtained from a material such as dichlorodi-p-xylylene, parylene, polytetrachloroparaxylene, and polydimethylparaxylene by using the CVD method.

Figure 4:
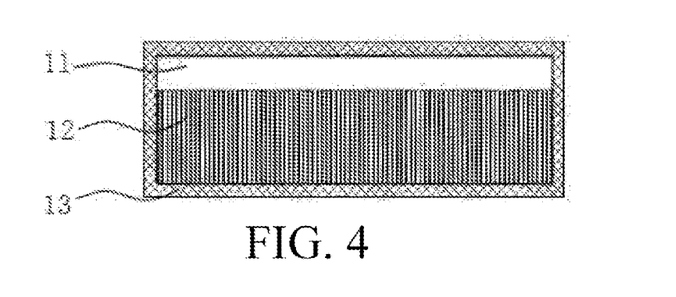
FIG. 4 is a schematic sectional structure diagram of making a moisture-proof layer on a periphery of the substrate on which the crystal column scintillator layer is formed.

An example is used in which the formation of a dichlorodi-p-xylylene film is formed on the periphery of the highly reflective PET substrate 11 on which the crystal column cesium iodide layer 12 is formed. As shown in FIG. 4, the highly reflective PET substrate 11 on which the crystal column cesium iodide layer 12 is formed is placed in a CVD device, and a first dichlorodi-p-xylylene film 13 with a predetermined thickness is formed on the periphery of the highly reflective PET substrate 11 and the crystal column cesium iodide layer 12 by using the CVD device. Preferably, it is best to form a first dichlorodi-p-xylylene film 13 with a thickness of 10 nm on the periphery of the highly reflective PET substrate 11 and the crystal column cesium iodide layer 12. By using the first dichlorodi-p-xylylene film 13, not only the impact of water vapor in the air on the crystal column cesium iodide layer 12 can be effectively reduced, but also the first dichlorodi-p-xylylene film 13 may be further used to fill gaps between crystal columns in the crystal column cesium iodide layer 12, to form a dense barrier layer and make the lower surface of the crystal column cesium iodide layer 12 flat.

Step S3. Make an X-ray absorption layer on a remaining surface of the moisture-proof layer made in step S2 except a surface for receiving X-rays.

The function of making an X-ray absorption layer on a remaining surface of the moisture-proof layer made in step S2 except a surface for receiving X-rays is to absorb X-rays that are not completely absorbed by the crystal column scintillator layer, and reduce the radiation interference of the X-rays on the X-ray image sensor. The vacuum magnetron sputtering method may be used to make an X-ray absorption layer with a predetermined thickness on the remaining surface of the moisture-proof layer except the surface for receiving X-rays. Preferably, the thickness of the X-ray absorption layer is adjusted appropriately according to an X-ray radiation dose and the crystal column scintillator layer, and an adjustment range of the thickness of the X-ray absorption layer is preferably 300 to 500 nm. In addition, the vacuum magnetron sputtering method is an existing conventional technology, and is not described in detail herein.

The X-ray absorption layer may be an oxide film obtained from a material with a high atomic number Z such as lead oxide (PbO), bismuth oxide (Bi2O3), lead oxide (PbxOy), or tungsten trioxide (WO3) by using the vacuum magnetron sputtering method.

Figure 5:
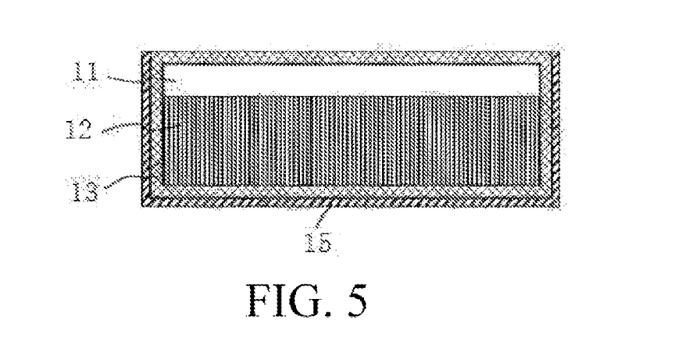
FIG. 5 is a schematic sectional structure diagram of making an X-ray absorption layer on a remaining surface of the moisture-proof layer except an upper surface thereof.

An example is used in which the X-ray absorption layer is a PbO film. As shown in FIG. 5, the highly reflective PET substrate 11 with the crystal column cesium iodide layer 12 and the first dichlorodi-p-xylylene film 13 made in step S2 is placed in a vacuum magnetron sputtering device, to form, under the vacuum condition, a PbO film 15 with a thickness of 500 nm on the remaining surface except the upper surface of the first dichlorodi-p-xylylene film 13 by using the vacuum magnetron sputtering method.

Step S4. Make a protective layer on an outer surface of the X-ray absorption layer made in step S3 and on the surface of the moisture-proof layer for receiving X-rays made in step S2.

To prevent the X-ray absorption layer made in step S3 and the moisture-proof layer made in step S2 from being scratched or peeled off, and to further reduce the impact of the water vapor in the air on the moisture-proof layer, the CVD method may be used to deposit a protective layer on the outer surface of the X-ray absorption layer made in step S3 and on the surface of the moisture-proof layer for receiving X-rays made in step S2.

The protective layer may be a transparent organic film obtained from a material such as dichlorodi-p-xylylene, parylene, polytetrachloroparaxylene, or polydimethylparaxylene by using the CVD method.

Figure 6:
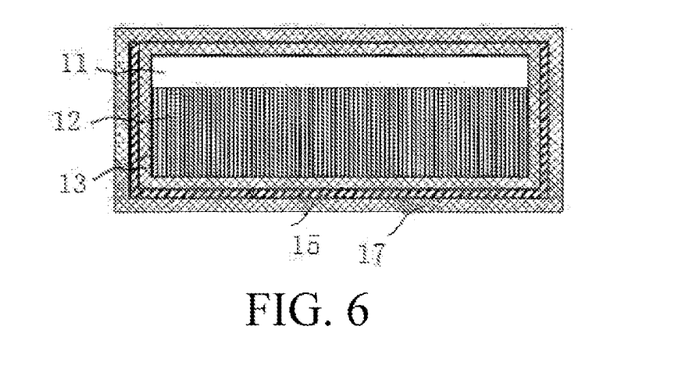
FIG. 6 is a schematic sectional structure diagram of making a protective layer on an outer surface of the X-ray absorption layer and the upper surface of the moisture-proof layer.

An example is used in which the protective layer is a dichlorodi-p-xylylene film. As shown in FIG. 6, the highly reflective PET substrate 11 with the crystal column cesium iodide layer 12, the first dichlorodi-p-xylylene film 13, and the PbO film 15 made in step S3 is placed in the CVD device, and a second dichlorodi-p-xylylene film 17 with a predetermined thickness is formed on the upper surface of the first dichlorodi-p-xylylene film 13 and the outer surface of the PbO film 15 by using the CVD device. Preferably, it is best to form a second dichlorodi-p-xylylene film 17 with a thickness of 10 nm on the upper surface of the first dichlorodi-p-xylylene film 13 and the outer surface of the PbO film 15. The second dichlorodi-p-xylylene film 17 can not only prevent the first dichlorodi-p-xylylene film 13 and the PbO film 15 from being scratched or peeled off, but also can effectively reduce the impact of the water vapor in the air on the crystal column cesium iodide layer 12.

Figure 2:
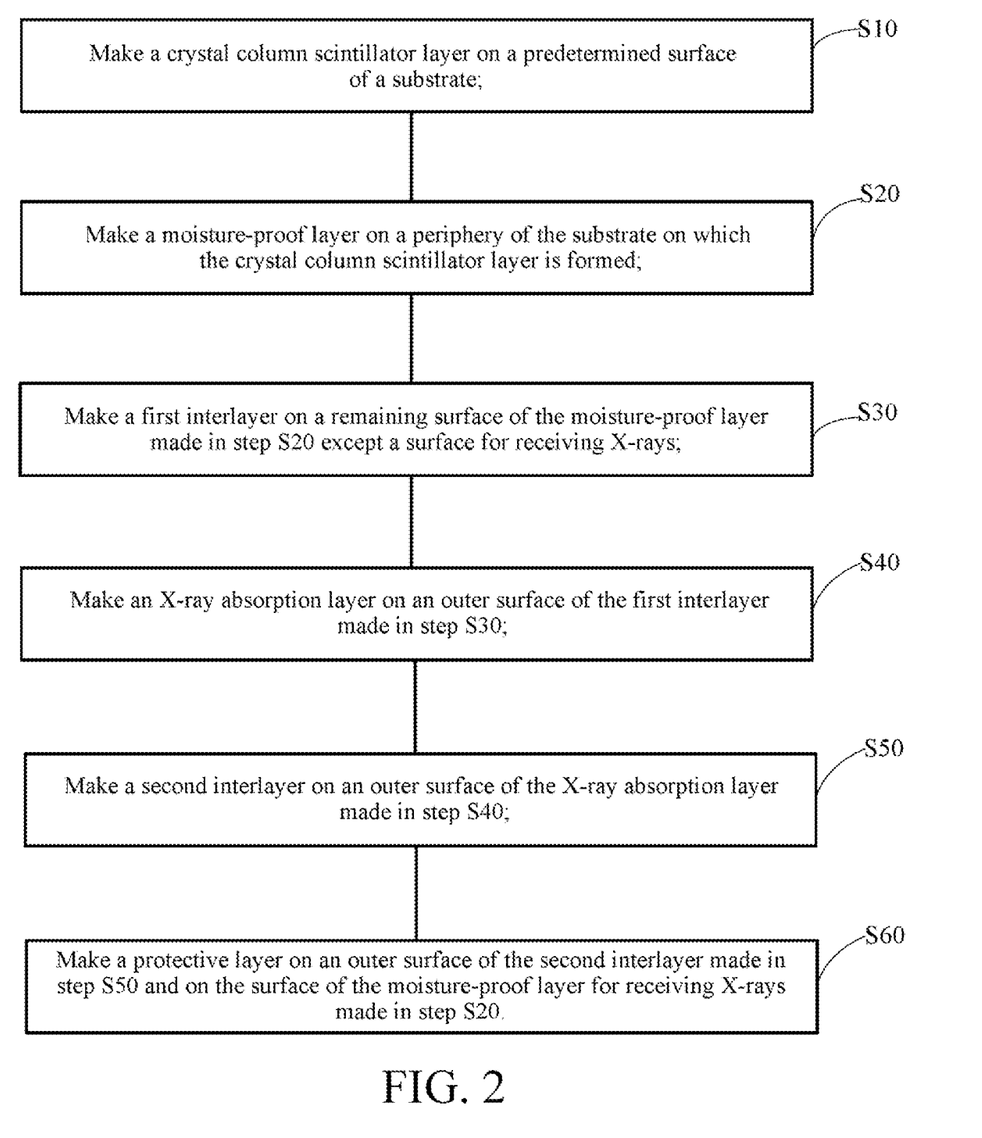
FIG. 2 is a flowchart 2 of a scintillator screen manufacturing method according to an embodiment of the present invention.

By using the foregoing steps S1 to S4, a crystal column scintillator screen may be made. To improve a combination effect of the moisture-proof layer and the X-ray absorption layer in the crystal column scintillator screen, and improve the moisture resistance of the crystal column scintillator layer and the transmittance of the visible light converted thereby, as shown in FIG. 2, the scintillator screen manufacturing method further provides the following preferred solutions, including the following steps:

Step S10. Make a crystal column scintillator layer on a predetermined surface of a substrate.

This step has the same description as that in step S1 and the substeps of step S1.

Step S20. Make a moisture-proof layer on a periphery of the substrate on which the crystal column scintillator layer is formed.

Description of this step is the same as that of step S2.

Step S30. Make a first interlayer on a remaining surface of the moisture-proof layer made in step S20 except a surface for receiving X-rays.

The function of making a first interlayer on a remaining surface of the moisture-proof layer made in step S20 except a surface for receiving X-rays is to improve the combination effect of the moisture-proof layer and the X-ray absorption layer made in the subsequent steps, and further improve the moisture resistance of the crystal column scintillator layer and the transmittance of the visible light converted thereby. The vacuum magnetron sputtering method may be used to make a first interlayer with a predetermined thickness on the remaining surface of the moisture-proof layer except the surface for receiving X-rays. Preferably, the thickness of the first interlayer is adjusted appropriately according to light output requirements, and an adjustment range of the thickness of the first interlayer is preferably 50 to 200 nm.

The first interlayer may be an inorganic anti-reflection film obtained from a material such as silicon dioxide (SiO2), titanium dioxide (TiO2), silicon nitride (SiN), magnesium fluoride (MgF2), or silicon oxynitride (SiNO) by using the vacuum magnetron sputtering method.

Figure 7:
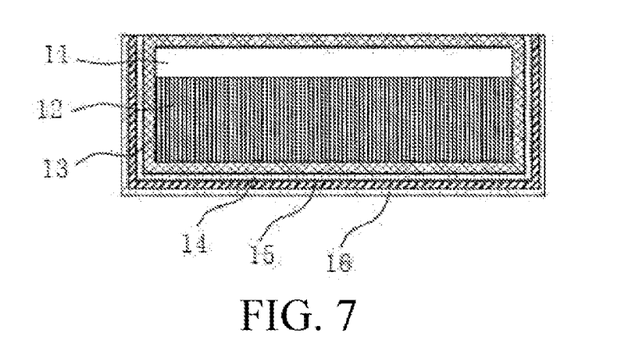
FIG. 7 is a schematic sectional structure diagram of sequentially making a first interlayer, an X-ray absorption layer, and a second interlayer on the remaining surface of the moisture-proof layer except the upper surface thereof.

An example is used in which the first interlayer is a SiO2 film. As shown in FIG. 7, the highly reflective PET substrate 11 with the crystal column cesium iodide layer 12 and the first dichlorodi-p-xylylene film 13 made in step S20 is placed in a vacuum magnetron sputtering device, to form, under the vacuum condition, a first SiO2 film 14 with a thickness of 100 nm on the remaining surface except the upper surface of the first dichlorodi-p-xylylene film 13 by using the vacuum magnetron sputtering method.

Step S40. Make an X-ray absorption layer on an outer surface of the first interlayer made in step S30.

The function of making an X-ray absorption layer on an outer surface of the first interlayer made in step S30 is to absorb X-rays that are not completely absorbed by the crystal column scintillator layer, and reduce the radiation interference of the X-rays on the X-ray image sensor. The vacuum magnetron sputtering method may be used to make an X-ray absorption layer with a predetermined thickness on the outer surface of the first interlayer. Preferably, the thickness of the X-ray absorption layer is adjusted appropriately according to an X-ray radiation dose and the crystal column scintillator layer, and an adjustment range of the thickness of the X-ray absorption layer is preferably 300 to 500 nm.

The X-ray absorption layer may be an oxide film obtained from a material with a high atomic number Z such as lead oxide (PbO), bismuth oxide (Bi2O3), lead oxide (PbxOy), and tungsten trioxide (WO3) by using the vacuum magnetron sputtering method.

An example is used in which the X-ray absorption layer is a PbO film. As shown in FIG. 7, the highly reflective PET substrate 11 with the crystal column cesium iodide layer 12, the first dichlorodi-p-xylylene film 13, and the first SiO2 film 14 made in step S30 is placed in a vacuum magnetron sputtering device, to form, under the vacuum condition, a PbO film 15 with a thickness of 500 nm on an outer surface of the first SiO2 film 14 by using the vacuum magnetron sputtering method.

Step S50. Make a second interlayer on an outer surface of the X-ray absorption layer made in step S40.

The function of making a second interlayer on an outer surface of the X-ray absorption layer made in step S40 is to improve the moisture resistance of the crystal column scintillator layer and the transmittance of the visible light converted thereby. The vacuum magnetron sputtering method may be used to make a second interlayer with a predetermined thickness on the outer surface of the X-ray absorption layer. Preferably, the thickness of the second interlayer is adjusted appropriately according to light output requirements, and an adjustment range of the thickness of the second interlayer is preferably 50 to 200 nm.

The second interlayer may be an inorganic anti-reflection film obtained from a material such as SiO2, TiO2, SiN, MgF2, or SiNO by using the vacuum magnetron sputtering method.

An example is used in which the second interlayer is a SiO2 film. As shown in FIG. 7, the highly reflective PET substrate 11 with the crystal column cesium iodide layer 12, the first dichlorodi-p-xylylene film 13, the first SiO2 film 14, and the PbO film 15 made in step S40 is placed in a vacuum magnetron sputtering device, to form, under the vacuum condition, a second SiO2 film 16 with a thickness of 100 nm on an outer surface of the PbO film 15 by using the vacuum magnetron sputtering method.

Step S60. Make a protective layer on an outer surface of the second interlayer made in step S50 and on the surface of the moisture-proof layer for receiving X-rays made in step S20.

To prevent the second interlayer made in step S50 and the moisture-proof layer made in step S20 from being scratched or peeled off, and to further reduce the impact of the water vapor in the air on the moisture-proof layer, the CVD method may be used to deposit a protective layer on the outer surface of the second interlayer made in step S50 and on the surface of the moisture-proof layer for receiving X-rays made in step S20.

The protective layer may be a transparent organic film obtained from a material such as dichlorodi-p-xylylene, parylene, polytetrachloroparaxylene, and polydimethylparaxylene by using the CVD method.

Figure 8:
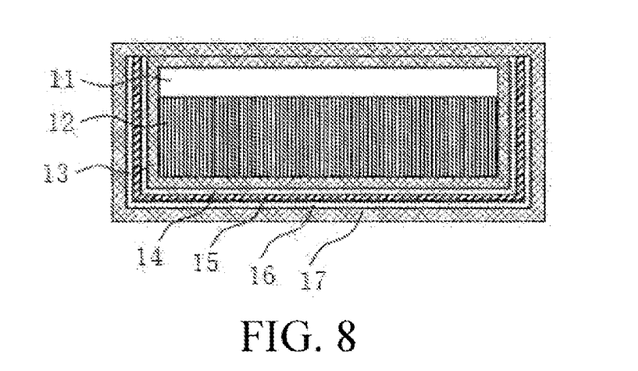
FIG. 8 is a schematic sectional structure diagram of making a protective layer on an outer surface of the second interlayer and the upper surface of the moisture-proof layer.

An example is used in which the protective layer is a dichlorodi-p-xylylene film. As shown in FIG. 8, the highly reflective PET substrate 11 with the crystal column cesium iodide layer 12, the first dichlorodi-p-xylylene film 13, the first SiO2 film 14, the PbO film 15, and the second SiO2 film 16 made in step S50 is placed in the CVD device, and a second dichlorodi-p-xylylene film 17 with a predetermined thickness is formed on the upper surface of the first dichlorodi-p-xylylene film 13 and the outer surface of the second SiO2 film 16 by using the CVD device. Preferably, it is best to form a second dichlorodi-p-xylylene film 17 with a thickness of 10 nm on the upper surface of the first dichlorodi-p-xylylene film 13 and the outer surface of the second SiO2 film 16. The second dichlorodi-p-xylylene film 17 can not only prevent the first dichlorodi-p-xylylene film 13 and the second SiO2 film 16 from being scratched or peeled off, but also can effectively reduce the impact of the water vapor in the air on the crystal column cesium iodide layer 12.

Figure 9:
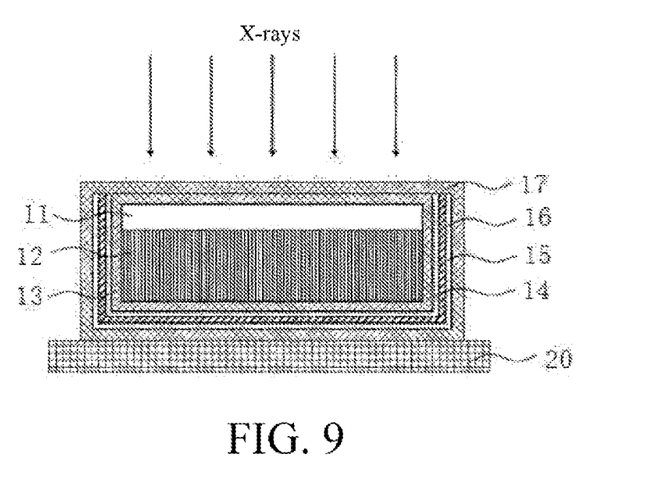
FIG. 9 is a schematic structural diagram of an X-ray image detector formed by a scintillator screen according to an embodiment of the present invention.

By using the foregoing steps S10 to S60, another crystal column scintillator screen may be made. As shown in FIG. 9, an X-ray image sensor 20 is disposed at a bottom of any one of the foregoing two crystal column scintillator screens to form an X-ray image detector. The crystal column scintillator screen is used to convert incident X-rays into visible light, and then transmit the visible light to an X-ray image sensor, so that the X-ray image sensor and an electronic circuit in the X-ray image sensor convert the received visible light into an analog signal, and the analog signal is converted into a digital signal by using an A/D converter (analog/digital converter), and is then transmitted to a computer to obtain an initial digital image of the X-rays.

According to the scintillator screen manufacturing method provided in the foregoing embodiment, the crystal column scintillator layer, the moisture-proof layer, the X-ray absorption layer, and the protective layer are sequentially made, to improve the X-ray absorptivity, the converted visible light transmittance, and the moisture resistance of the formed scintillator screen. In addition, the X-ray absorption layer is added to absorb X-rays that are not completely absorbed by the crystal column scintillator layer, which implements X-ray shielding of an electronic circuit of the X-ray image sensor, thereby reducing the radiation interference of X-rays on the X-ray image sensor.

In another aspect, a cesium iodide screen grown on the flexible substrate is light, thin, resistant to bending, and has good water resistance. However, if cesium iodide is thermally evaporated on some large-sized flexible substrates with low softening temperature, the substrate is easily deformed in an evaporation process. In addition, a difference in heat dissipation capacity of different parts of the substrate in a film plating process leads to increased temperature differences in different parts of the substrate and affects the uniformity of film plating.

For the problem that when a crystal column cesium iodide scintillator is evaporated on a large-size flexible substrate, the substrate is easily deformed, and a difference in heat dissipation capacity of different parts of the substrate in a film plating process leads to significant unevenness in the film, this embodiment of the present invention further provides a scintillator screen manufacturing method that prevents the flexible substrate from deforming during a high-temperature film plating process and significantly improves the uniformity of film plating.

Figure 10:
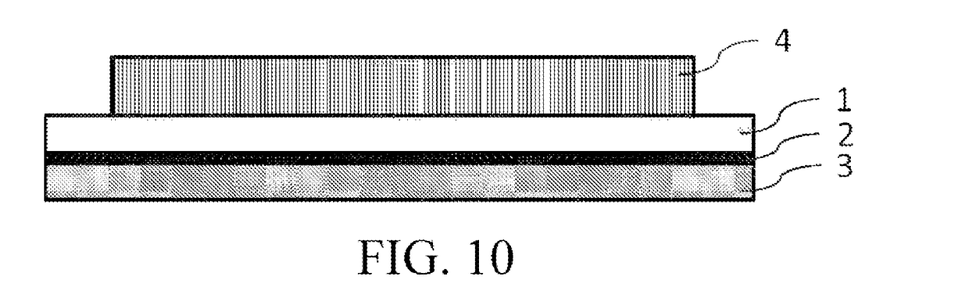
FIG. 10 to FIG. 12 are respectively flowcharts of a scintillator screen manufacturing method based on a flexible substrate according to an embodiment of the present invention.
Figure 11:
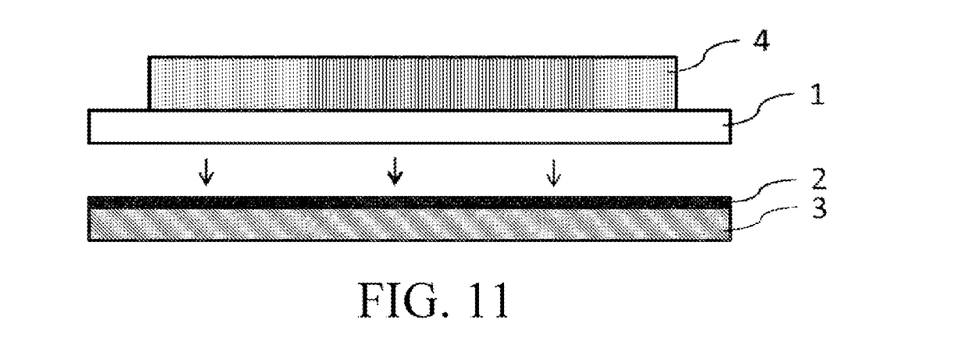
Figure 12:
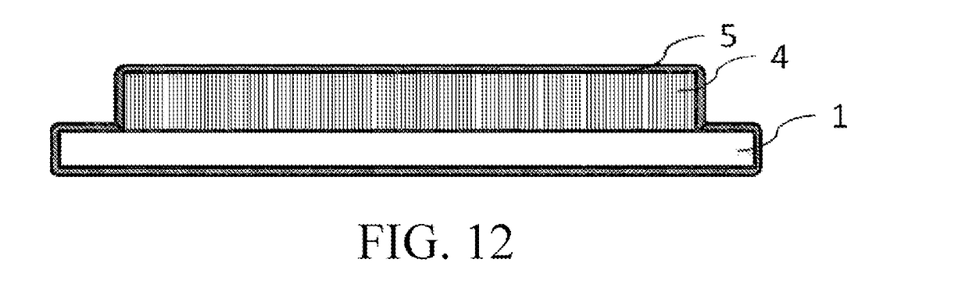

The foregoing scintillator screen manufacturing method based on a flexible substrate includes the following steps:

a. providing a flexible substrate 1, the flexible substrate 1 having at least one surface with a high visible light reflectivity or a high visible light absorptivity;

b. fixing an other surface opposite to the surface of the flexible substrate 1 with a high visible light reflectivity or a high visible light absorptivity on a thermally conductive rigid substrate 3 by using a uniformly filled thermally conductive adhesive 2; and c. preparing a scintillator layer 4 on the surface of the flexible substrate 1 with a high visible light reflectivity or a high visible light absorptivity;

d. peeling off and removing the thermally conductive rigid substrate 4 and the thermally conductive adhesive 3; and e. preparing a waterproof protective layer 5 on an outside of the foregoing structure, so that the waterproof protective layer 5 covers at least the scintillator layer 4 completely, to obtain a complete scintillator screen that is based on the flexible substrate.

A description is made below with reference to structures shown in FIG. 10 to FIG. 12.

The flexible substrate 1 provided in step (1) may be optionally made of PET, Polyimide (PI), polyethylene (PE), polymethylmethacrylate (PMMA), or the like, or the foregoing materials after surface processing.

The flexible substrate 1 has at least one surface with a visible light reflectivity of 80% to 100% or 0% to 20%. When the flexible substrate 1 has at least one surface with a visible light reflectivity of 80% to 100%, the flexible substrate 1 has at least one surface with a high visible light reflectivity, and the flexible substrate 1 may be used to prepare a high-brightness and low-resolution scintillator screen. When a visible light reflectivity of at least one surface of the flexible substrate 1 is 0 to 20%, the flexible substrate 1 has at least one surface with a high visible light absorptivity, and the flexible substrate 1 is used to prepare a high-resolution scintillator screen. In the structures shown in FIG. 10 to FIG. 12, the surface of the flexible substrate 1 with a visible light reflectivity or a high visible light absorptivity is the upper surface.

The flexible substrate 1 may alternatively be a transparent flexible substrate, and a light reflection layer or a light absorption layer is prepared on at least one surface of the flexible substrate 1 (a surface used to evaporate the scintillator layer 4), so that the surface has a high visible light reflectivity or a high visible light absorptivity, and the same function may be implemented.

In step (2), the other surface (that is, the lower surface of the flexible substrate 1 in FIG. 10 to FIG. 12) opposite to the surface of the flexible substrate 1 with a high visible light reflectivity or a high visible light absorptivity is fixed on the thermally conductive rigid substrate 3 by using the uniformly filled thermally conductive adhesive 2.

The thermally conductive rigid substrate 3 may be aluminum alloy, copper alloy, stainless steel, or the like, and the thermal conductivity is greater than 10 W/mK. The thermally conductive adhesive 2 may be glue or a double-sided tape, and the thermal conductivity is greater than 1 W/mK. A thermal expansion coefficient of the thermally conductive adhesive 2 is to be between a thermal expansion coefficient of the flexible substrate and a thermal expansion coefficient of the thermally conductive rigid substrate. A filling manner of the glue may be a casting method, a pulling method, screen printing, spray coating, or the like. When necessary, high-pressure or low-pressure defoaming may be combined to ensure that the flexible substrate 1 and the thermally conductive rigid substrate 3 are closely attached.

In step (2), the thermally conductive adhesive 2 is to have a suitable combining strength with the flexible substrate 1 while having a high thermal conductivity. When the combining strength is excessively low, the thermally conductive adhesive is easily peeled off in the subsequent film plating process and cannot perform thermal conduction; and when the combining strength is excessively high, there is a problem that the thermally conductive rigid substrate is not easily peeled off after the scintillator layer is evaporated.

In step (3), the scintillator layer 4 is prepared on the surface of the flexible substrate 1 with a high visible light reflectivity or a high visible light absorptivity. In the structures shown in FIG. 10 to FIG. 12, the scintillator layer 4 is evaporated on the upper surface of the flexible substrate 1.

The material of the scintillator may be CsI(Tl), CsI(Na), or other doped columnar CsI crystals, and a manufacturing method may be thermal evaporation, laser evaporation, or the like.

Through the foregoing three steps, the structure shown in FIG. 10 may be obtained.

In step (4), the thermally conductive rigid substrate 3 and the thermally conductive adhesive 2 are peeled off and removed. FIG. 11 schematically shows removing the thermally conductive rigid substrate 3 and the thermally conductive adhesive 2 from the structure shown in FIG. 10. Optional peeling methods include mechanical peeling, light peeling, laser peeling, and the like. A specific peeling process may be determined according to properties of the thermally conductive rigid substrate 3 and the thermally conductive adhesive 2. In the peeling process, the integrity of the flexible substrate 1 and the scintillator layer 4 is to be ensured, the flexible substrate 1 is to be prevented from deforming, and the scintillator layer 4 is to be prevented from peeling off.

If the thermally conductive rigid substrate 3 and the thermally conductive adhesive 2 have no obvious blocking effect on X-rays, step (4) may be skipped without removing the auxiliary materials, and a final product is a scintillator screen with a composite substrate.

In step (5), the waterproof protective layer 5 is prepared by using an existing technology to obtain a complete scintillator screen. The waterproof protective layer 5 is to at least completely cover the scintillator layer 4, and wrap the scintillator layer 4 inside to implement the function of waterproof and moisture proof. The waterproof protective layer 5 that may be used includes, but not limited to, an attaching transparent Pi film (polyimide film), a PET film (polyester film), an evaporated parylene film, or the like, or a composite coating composed of the foregoing film and a dense inorganic waterproof film such as $SiO_2$, $TiO_2$, and $Al_2O_3$.

In the embodiment shown in FIG. 12, the waterproof protective layer 5 is provided on an outside of the flexible substrate 1 and the scintillator layer 4, and the waterproof protective layer 5 wraps the flexible substrate 1 and the scintillator layer 4 entirely inside. In an embodiment not shown, the waterproof protective layer 5 may only cover the scintillator layer 4 and a surface of the substrate in a region near the edge of the scintillator layer 4, and the same waterproof effect may be achieved.

In the foregoing manufacturing method, the other surface (the surface away from the surface for the flexible substrate to evaporate the crystal column scintillator) opposite to the surface on which the crystal column scintillator is evaporated on the flexible substrate is fixed on the thermally conductive rigid substrate by using the uniformly filled thermally conductive adhesive, to implement the fixation and rapid thermal conduction of the flexible substrate in the high-temperature evaporation process, prevent the flexible substrate from deforming due to gravity or uneven heating, and significantly improve the uniformity of film plating.

In the foregoing manufacturing method, the thermally conductive rigid substrate with a high thermal conductivity is used as an auxiliary substrate, and the thermally conductive adhesive with a high thermal conductivity is used as a thermally conductive adhesive material, to fix the flexible substrate and the auxiliary substrate to implement the fixation and rapid thermal conduction of the flexible substrate in the evaporation process, prevent the flexible substrate from deforming, and improve the uniformity of film plating.

When step (4) is included in the foregoing manufacturing method, a structure of the scintillator screen based on the flexible substrate obtained is shown in FIG. 12. The scintillator screen based on the flexible substrate includes the flexible substrate 1, the scintillator layer 4, and the waterproof protective layer 5. The scintillator layer 4 is provided on the surface of the flexible substrate 1 with a high visible light reflectivity or a high visible light absorptivity. The waterproof protective layer 5 covers at least the scintillator layer 4 completely.

In addition, when the foregoing manufacturing method does not include step (4) and the auxiliary materials are not removed, a final product obtained is a scintillator screen with a composite substrate, including the flexible substrate 1, the thermally conductive adhesive 2, the thermally conductive rigid substrate 3, the scintillator layer 4, and the waterproof protective layer 5. The scintillator layer 4 is provided on the surface of the flexible substrate 1 with a high visible light reflectivity or a high visible light absorptivity. The other surface of the flexible substrate 1 is fixed on the thermally conductive rigid substrate 4 by using the uniformly filled thermally conductive adhesive 2. The waterproof protective layer 5 covers at least the scintillator layer 4 completely.

In the foregoing two structures, the waterproof protective layer 5 may only cover the scintillator layer 4 and a surface of the substrate in a region near the edge of the scintillator layer 4, or may wrap the entire structure of the scintillator screen inside the waterproof protective layer 5.

Except for application scenarios in which flexible screens are clearly required, scintillator screens with the foregoing two structures may be used in most application scenarios. Similar to the embodiment shown in FIG. 9, an X-ray image sensor 20 is disposed at a bottom of any one of the foregoing scintillator screens with the two structures, to form a corresponding X-ray image detector.

Based on the above, according to the scintillator screen manufacturing method based on a flexible substrate provided in the embodiments of the present invention, the other surface opposite to the surface of the flexible substrate with a high visible light reflectivity or a high visible light absorptivity is fixed on the thermally conductive rigid substrate by using the uniformly filled thermally conductive adhesive, to implement the fixation and rapid thermal conduction of the flexible substrate in the high-temperature evaporation process, prevent the flexible substrate from deforming due to gravity or uneven heating, and significantly improve the uniformity of film plating.

The scintillator screen manufacturing method, the scintillator screen, and the image detector provided in the present invention are described above in detail. For a person of ordinary skill in the art, any obvious change made to the present invention without departing from the essential content of the invention shall fall within the protection scope of the patent right of the present invention.

What is claimed is:
1. A scintillator screen manufacturing method, comprising the following steps:
    making a crystal column scintillator layer on a predetermined surface of a substrate;
    making a moisture-proof layer on a periphery of the substrate on which the crystal column scintillator layer is formed;
    making an X-ray absorption layer on a remaining surface of the moisture-proof layer except on the surface for receiving X-rays; and making a protective layer on an outer surface of the X-ray absorption layer and on the surface of the moisture-proof layer for receiving X-rays.

2. The scintillator screen manufacturing method according to claim 1, wherein the making a crystal column scintillator layer on a predetermined surface of a substrate comprises the following substeps:
  selecting the substrate and a raw material to be formed into the crystal column scintillator layer; and
  forming, by using a vacuum evaporation method, the crystal column scintillator layer on the substrate by using the raw material to be formed into the crystal column scintillator layer.

3. The scintillator screen manufacturing method according to claim 1, wherein the substrate is selectively a substrate with a high visible light reflectivity and X-ray transmittance.

4. The scintillator screen manufacturing method according to claim 1, wherein the raw material to be formed into the crystal column scintillator layer is selectively an X-ray conversion material that converts X-rays into visible light.

5. The scintillator screen manufacturing method according to claim 1, wherein the moisture-proof layer and the protective layer are respectively transparent organic films obtained by using a chemical vapor deposition method.

6. The scintillator screen manufacturing method according to claim 1, wherein
  the X-ray absorption layer is an oxide film obtained from a material with a high atomic number by using a vacuum magnetron sputtering method.

7. A scintillator screen manufacturing method, comprising the following steps:
  making a crystal column scintillator layer on a predetermined surface of a substrate;
  making a moisture-proof layer on a periphery of the substrate on which the crystal column scintillator layer is formed;
  making a first interlayer on a remaining surface of the moisture-proof layer except on the surface for receiving X-rays;
  making an X-ray absorption layer on an outer surface of the first interlayer;
  making a second interlayer on an outer surface of the X-ray absorption layer; and
  making a protective layer on an outer surface of the second interlayer and on the surface of the moisture-proof layer for receiving X-rays.

8. The scintillator screen manufacturing method according to claim 7, wherein the making a crystal column scintillator layer on a predetermined surface of a substrate comprises the following substeps:
  selecting the substrate and a raw material to be formed into the crystal column scintillator layer; and
  forming, by using a vacuum evaporation method, the crystal column scintillator layer on the substrate by using the raw material to be formed into the crystal column scintillator layer.

9. The scintillator screen manufacturing method according to claim 7, wherein the substrate is selectively a substrate with a high visible light reflectivity and X-ray transmittance.

10. The scintillator screen manufacturing method according to claim 7, wherein the raw material to be formed into the crystal column scintillator layer is selectively an X-ray conversion material that converts X-rays into visible light.

11. The scintillator screen manufacturing method according to claim 7, wherein the moisture-proof layer and the protective layer are respectively transparent organic films obtained by using a chemical vapor deposition method.

12. The scintillator screen manufacturing method according to claim 7, wherein
  the X-ray absorption layer is an oxide film obtained from a material with a high atomic number by using a vacuum magnetron sputtering method.

13. The scintillator screen manufacturing method according to claim 7, wherein
  the first interlayer and the second interlayer are each an inorganic anti-reflection film obtained by using a vacuum magnetron sputtering method.

14. A scintillator screen manufacturing method based on a flexible substrate, comprising the following steps:
  (1) providing a flexible substrate, the flexible substrate having at least one surface with a visible light reflectivity of 80% to 100% or 0% to 20% or a high visible light absorptivity;
  (2) fixing another surface opposite to the surface of the flexible substrate with a high visible light reflectivity or a high visible light absorptivity on a thermally conductive rigid substrate by using a uniformly filled thermally conductive adhesive; and
  (3) preparing a scintillator layer on the surface of the flexible substrate with a high visible light reflectivity or a high visible light absorptivity.

15. The scintillator screen manufacturing method according to claim 14, further comprising step (4): peeling off and removing the thermally conductive rigid substrate and the thermally conductive adhesive.

16. The scintillator screen manufacturing method according to claim 15, further comprising step (5): preparing a waterproof protective layer on an outside of the foregoing structure, so that the waterproof protective layer covers at least the scintillator layer completely.

17. The scintillator screen manufacturing method according to claim 14, wherein a thermal conductivity of the thermally conductive rigid substrate is greater than 10 W/mK;
  a thermal conductivity of the thermally conductive adhesive is greater than 1 W/mK; and a thermal expansion coefficient of the thermally conductive adhesive is to be between a thermal expansion coefficient of the flexible substrate and a thermal expansion coefficient of the thermally conductive rigid substrate.

\* \* \* \* \*